United States Patent
Rottstegge

(10) Patent No.: US 7,045,274 B2
(45) Date of Patent: *May 16, 2006

(54) PROCESS FOR STRUCTURING A PHOTORESIST BY UV AT LESS THAN 160 NM AND THEN AROMATIC AND/OR ALICYCLIC AMPLIFICATION

(75) Inventor: Jörg Rottstegge, Erlangen (DE)

(73) Assignee: Infineon Technologies AG, Munich (DE)

( * ) Notice: Subject to any disclaimer, the term of this patent is extended or adjusted under 35 U.S.C. 154(b) by 169 days.

This patent is subject to a terminal disclaimer.

(21) Appl. No.: 10/285,052

(22) Filed: Oct. 31, 2002

(65) Prior Publication Data

US 2003/0099906 A1    May 29, 2003

(30) Foreign Application Priority Data

Oct. 31, 2001    (DE) ................... 101 53 496

(51) Int. Cl.
*G03F 7/20* (2006.01)
*G03F 7/32* (2006.01)
*G03F 7/40* (2006.01)
*G03F 7/39* (2006.01)
*B01J 31/02* (2006.01)

(52) U.S. Cl. .............. 430/296; 430/311; 430/315; 430/270.1; 430/324; 430/326; 430/330; 430/331; 502/167

(58) Field of Classification Search ........ 430/296, 430/311, 313, 315, 330, 270.1, 323–326, 430/328, 331
See application file for complete search history.

(56) References Cited

U.S. PATENT DOCUMENTS 3,988,256 A * 10/1976 Vandermey et al. .......... 134/36
4,051,271 A * 9/1977 Fujishige .................. 430/285.1
4,491,628 A * 1/1985 Ito et al. ..................... 430/176
4,609,615 A * 9/1986 Yamashita et al. .......... 430/325
4,686,168 A * 8/1987 Fujii et al. ................. 430/326
5,173,393 A * 12/1992 Sezi et al. .................. 430/323
5,234,793 A * 8/1993 Sebald et al. ............... 430/323
5,234,794 A    8/1993 Sebald et al.

(Continued)

FOREIGN PATENT DOCUMENTS

EP    1041445 A2 * 10/2000

OTHER PUBLICATIONS

Grant & Hackh, Chemical Dictionary, 1987, McGraw-Hill, Inc., 5th Edition, p. 22.*

(Continued)

*Primary Examiner*—Mark F. Huff
*Assistant Examiner*—John Ruggles
(74) *Attorney, Agent, or Firm*—Laurence A. Greenberg; Werner H. Stemer; Ralph E. Locher

(57) ABSTRACT

A process amplifies structured resists by utilizing a reaction between a nucleophilic group and an isocyanate group or thiocyanate group to link an amplification agent to a polymer present in the photoresist. The amplification agent includes aromatic and/or cycloaliphatic groups. An isocyanate group or a thiocyanate group and a nucleophilic group form a reaction pair; one of the partners is provided on the polymer and the other partner on the amplification agent. The amplification reaction takes place more rapidly than a linkage to carboxylic anhydride groups. Furthermore, the amplification reaction permits the use of polymers which have high transparency at short wavelengths of less than 200 nm, in particular 157 nm.

12 Claims, 3 Drawing Sheets

U.S. PATENT DOCUMENTS

| | | | |
|---|---|---|---|
| 5,403,699 A * | 4/1995 | Takechi et al. | 430/296 |
| 5,650,261 A * | 7/1997 | Winkle | 430/270.1 |
| 6,524,775 B1 * | 2/2003 | Oberlander et al. | 430/327 |
| 6,746,821 B1 * | 6/2004 | Richter et al. | 430/311 |
| 2001/0001703 A1 * | 5/2001 | Takahashi et al. | 430/322 |
| 2002/0068808 A1 * | 6/2002 | Kometani et al. | 528/54 |
| 2002/0146638 A1 * | 10/2002 | Ito et al. | 430/270.1 |
| 2003/0073043 A1 * | 4/2003 | Rottstegge et al. | 430/322 |

OTHER PUBLICATIONS

Kleimann, Helmut, Die Angewandte Makromoleculare Chemie, 98 (1981), pp. 185-194 (No. 1580), Bayer AG, Polyurethan-Anwendungstechnik, D-5090 Leverkusen, translated title: Basically Catalyzed Isocyanate—Amine Reaction.*

* cited by examiner

PROCESS FOR STRUCTURING A PHOTORESIST BY UV AT LESS THAN 160 NM AND THEN AROMATIC AND/OR ALICYCLIC AMPLIFICATION

BACKGROUND OF THE INVENTION

Field of the Invention

The invention relates to a process for the amplification of structured resists as used in the production of microelectronic components.

In order to increase the computational speed of processors and the storage volume of storage elements and to reduce the costs of the components, chips which have increasingly small structures and hence an increasingly high density of components are being developed in the semiconductor industry. A particular challenge is the reduction of the minimum structure size. These requirements have been met to date in optical lithography by changing to shorter and shorter wavelengths. However, in the case of a structure size of from 100 to 70 nm, the methods known to date that use wavelengths down to 193 nm, have reached the limit of their resolution. It is therefore necessary to develop novel methods. Optical lithography has particularly good prospects for use in industry, a radiation having a wavelength of 157 nm being used for exposure since the chip manufacturers can continue to utilize their extensive knowledge in optical lithography in this case. A substantial difficulty with the use of an exposure radiation having a wavelength of 157 nm is the unsatisfactory transparency of materials used to date. For industrial use, the base polymer in these high-resolution resists must have as high a transparency as possible, while the photosensitive chemicals with which, for example, an acid is produced in the resist must have a high quantum yield.

Some of the resists currently used for the production of microchips operate with so-called chemical amplification. The exposure in a photochemical reaction changes the chemical structure of the photoresist. In the case of resists that have not been chemically amplified, not more than one acid-labile group per light quantum is cleaved. The quantum yield may therefore be one at the most. In the case of chemically amplified resists, a multiplicity of acid-labile groups can be cleaved with one light quantum. Quantum yields of more than 100 are therefore possible. In the case of a positive-working chemically amplified resist, for example, the exposure produces a strong acid that catalytically converts or cleaves the resist in a subsequent heating step. As a result of this chemical reaction, the solubility of the polymer in a developer is dramatically changed so that a substantial differentiation between exposed and unexposed parts is possible.

The structured photoresists can be used as a mask for further processes, such as, for example, dry etching processes. If an organic chemical medium located underneath, for example in two-layer resists, is structured using the photoresist, the photoresist disposed as the uppermost layer must have high resistance to etching. For this purpose, either the photoresist may have appropriate groups of the polymer chain, for example silicon-containing groups, or the etch resistance of the photoresist is increased in a step following the structuring of the photoresist. For this purpose, reactive groups must be present as anchor groups in the polymer. These then react with a suitable reactive group of an amplification reagent, which group acts as a linkage group, with formation of a chemical bond. In this way, groups by which the etch resistance of the film can be increased can be introduced subsequently into the polymer. Thus, the etch resistance with respect to an oxygen plasma can be increased by introducing silicon-containing groups. It is also possible to increase the etch resistance with respect to a plasma by subsequently introducing aromatic or oligo- or polycyclic hydrocarbon radicals. Particularly for resist structures having a small layer thickness, subsequent amplification of the resist structures is therefore advantageous. The reaction for incorporating organosilicon compounds is often referred to as silylation, while the incorporation of aromatic groups is referred to as aromatization.

A process for the amplification of resist structures is described, for example, in European Patent No. EP 0 395 917 B1, which corresponds to U.S. Pat. Nos. 5,234,794 and 5,234,793. There, the photoresists used for exposure wavelengths of 248 and 193 nm are structured and then chemically amplified in their etch resistance by the incorporation of organosilicon or aromatic groups and thus form a sufficiently stable etch mask. For this purpose, the film-forming polymer of the photoresist contains reactive groups, for example anhydride groups. These anhydride groups react with basic groups of the amplification agent, for example a bifunctional aminosiloxane, amide bonds being formed between polymer and silylating agent with crosslinking of the resist structure. Finally, excess silylating agent is washed away with a suitable wash solution. Resists as used for exposure to radiation having a wavelength of 248 or 193 nm permit layer thicknesses in the range from 140 to 200 nm. A volume increase in the horizontal and vertical direction is affected by the amplification agent during the amplification. A narrowing of trenches of the resist structure and hence an improvement in the resolution are therefore possible. This subsequent narrowing of trenches is referred to as chemical amplification of resist lines (CARLs).

As already mentioned, the low transparency of the known photoresists at a wavelength of 157 nm is a substantial difficulty in the development of 157 nm technology. The high proportion of anhydride groups contributes decisively to the high absorption of the polymers used for the 193 nm technology at shorter wavelengths. Chemically amplifiable photoresists have a proportion of about 50% of anhydride groups. A further problem of amplification is the frequently slow rate of the reaction, which therefore sometimes requires high concentrations of amplifying agent. The reaction rate of the amplification and hence the growth in layer thickness increase with increasing solubility or swellability of the polymer in polar solvents. In order to permit a sufficient reaction rate or a sufficient growth in layer thickness, the amplification agent must be able to penetrate sufficiently deeply into the resist structure in order to be able to reach the reactive groups of the polymer and to be linked there to the polymer by an appropriate reaction. At the same time, the polymer must contain a sufficient number of groups to which the amplification agent can be linked. This reaction is additionally complicated by the small layer thicknesses that are required on exposure to radiation of very short wavelength, in order to ensure sufficient light intensity even in lower-lying layers of the resist.

SUMMARY OF THE INVENTION

It is accordingly an object of the invention to provide a process for the aromatization and alcyclization of photoresists in the UV range that overcomes the hereinaforementioned disadvantages of the heretofore-known processes of this general type and that amplify resist structures. The process subsequently increases the etching-plasma resistance of an already structured photoresist for the 157 nm technology.

With the foregoing and other objects in view, there is provided, in accordance with the invention, a process for the amplification of structured resists, which includes the following steps.

(a) Applying a chemically amplified photoresist to a substrate, the photoresist contains a polymer, a photo-acid generator, and a solvent. The polymer includes acid-labile groups that are eliminated under the action of acid and liberate groups that increase the solubility of the polymer in aqueous alkaline developers. Furthermore, the polymer includes anchor groups for the linkage of amplification agents. The anchor groups can be present in the form of a protected anchor group.

(b) Drying the photoresist to give a dried resist film;

(c) Structuring the resist film to give a structured resist;

(d) Optionally liberating the anchor groups from the protected anchor groups;

(e) Applying an amplification agent to the structured resist. The amplification agent includes aromatic and/or alicyclic hydrocarbon groups in which some or all of the hydrogen atoms also may have been replaced by fluorine atoms, and at least one linkage group for the linkage of the amplification agent to the anchor group of the polymer, so that anchor group and linkage group react with one another with formation of a chemical bond and the amplification agent is linked to the polymer by a covalent bond.

(f) Removing excess amplification agent;

The linkage group and anchor group form a pair that is formed from a group of the structure —N=C=X, where X=O or S or a nucleophilic group.

The process according to the invention uses the isocyanate group —N=C=O or the thiocyanate group —N=C=S as the group susceptible to nucleophilic attack. In comparison with the carboxylic anhydride group, these groups have higher reactivity so that the reaction rate and hence the growth in layer thickness can be increased compared with the carboxylic anhydride-containing polymers customary to date, or lower concentrations of amplification agent can be employed. A rapid, complete reaction is advantageous in particular in the case of very thin resists where the dry etch resistance has to be particularly greatly increased. Furthermore, the isocyanate group and the thiocyanate group have about 50% lower absorption for radiation of a wavelength of less than 160 nm compared with the carboxylic anhydride group. A further advantage that results from this is that the transparency of the polymer contained in the resist can also be increased at short wavelengths in comparison with anhydride-containing polymers, which permits an increase in the layer thickness of the photoresist.

The reaction taking place in the process according to the invention is shown below:

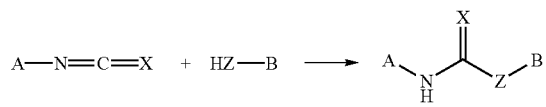

The letters A and B represent the polymer contained in the resist and the cycloaliphatic or aromatic amplification agent, respectively. The isocyanate group (x=O) or the thiocyanate group (X=S) therefore can be present either on the polymer or on the amplification agent in the process according to the invention. As a complement to this, the nucleophilic group is present on the amplification reagent or on the polymer. Z represents the nucleophilic group that attacks the isocyanate group or the thiocyanate group with formation of a covalent bond.

If the amplification agent is a functional aromatic hydrocarbon, it preferably includes 6 to 20 carbon atoms. An aromatic hydrocarbon is understood as meaning a hydrocarbon having a delocalized π-electron system. The hydrocarbon can include one or more aromatic rings that are preferably formed from 6 carbon atoms. The rings can be fused or linked via a single bond or a bivalent alkyl radical having 1 to 4 carbon atoms. If the amplification agent is a functionalized cycloaliphatic hydrocarbon radical, it preferably includes 6 to 20 carbon atoms. The cycloaliphatic hydrocarbon radical preferably includes a plurality of rings that are generally formed from 5 or 6 carbon atoms and may be linked via a single bond, a common carbon-carbon bond or a bivalent alkyl radical having 1 to 10 carbon atoms. Preferably, bi- or polycyclic compounds having, preferably, 7 to 20 carbon atoms are used as the parent structure of the amplification agent. Examples of such parent structures are adamantane, norbornane, bicyclo[2.2.2]octane and bicyclo[5.2.1.0$^{2,6}$]decane. One or more reactive groups are bonded to this parent structure, optionally via a short spacer. Spacers used are short bivalent alkyl chains having 1 to 6 carbon atoms, such as, for example, a methylene group, an ethylene group, or a propylene group. These carry a functional group, preferably as a terminal group. Functionalization of the amplification agent is understood as meaning an isocyanate group or a thiocyanate group or a nucleophilic group by which the amplification agent is linked to the polymer of the resist during amplification. In the amplification agents described above, some or all of the hydrogen atoms may have been replaced by fluorine atoms.

The process for the chemical amplification is carried out by a procedure in which first a chemically amplified photoresist is applied to a substrate, usually a silicon wafer, which may also have been structured in prior process steps, and in which electronic components may already have been integrated. It is also possible to use multilayer resists; the photoresist then forms the uppermost layer. Multilayer resists permit better focusing of the beam used for exposure onto the surface of the substrate.

The film-forming polymer contains, in the chain or as side groups, acid-labile groups. The acid-labile groups decrease the solubility of the polymer acquires in polar solvents. Through the catalytic action of acid and, if required, a simultaneous thermal treatment, the acid-labile groups are cleaved and polar groups are produced on the polymer. For example, the following groups may be used as the acid-labile groups: tert-alkyl ester, tert-butyl ester, tert-butoxycarbonyloxy, tetrahydrofuranyloxy, tetrahydropyranyloxy, tert-butyl ether, lactone, or acetal groups. These acid-labile groups can be introduced into the polymer, for example, by copolymerization of suitable monomers that include the acid-labile groups. Preferable monomers have repeating units in the polymer with high transparency at short wavelengths, for example of 157 nm. Such repeating units are, for example, perfluorinated or partially fluorinated hydrocarbon-containing groups. For example, carboxyl groups or, in particular, acidic hydroxyl groups are suitable as polar groups that are liberated after cleavage of the acid-labile group. Some repeating units that result in increased transparency of the polymer at short wavelengths of less than 200 nm, preferably less than 160 nm, in particular 157 nm, are shown as typical examples of a large number of suitable, repeating units.

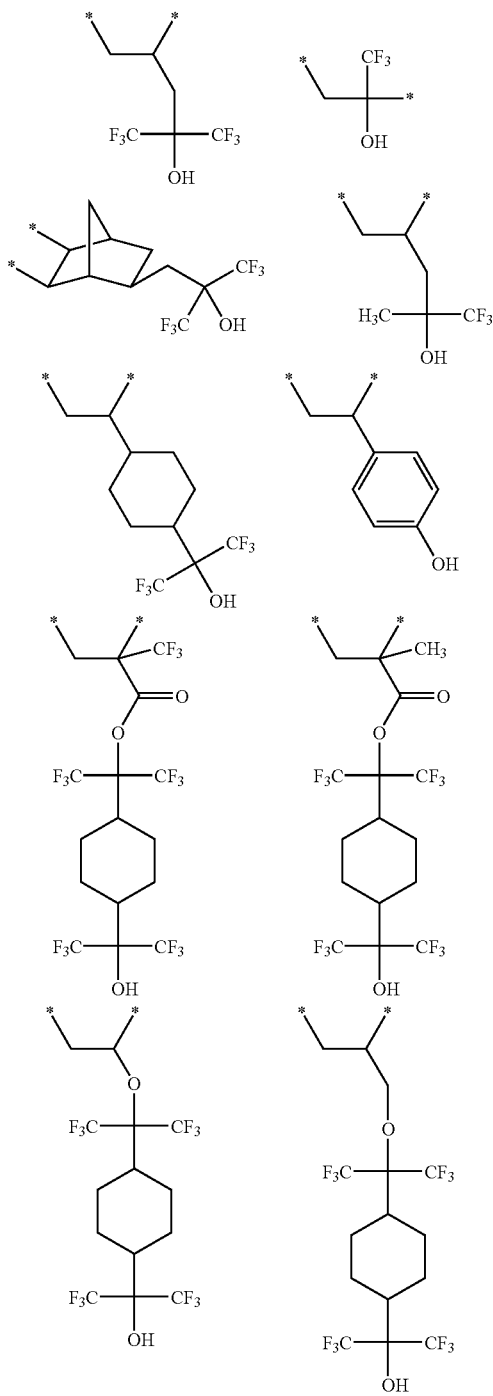

These repeating units can be introduced, for example, by free-radical (co)polymerization of the corresponding unsaturated monomers. The hydroxyl group of the repeating unit may be etherified, for example with a tert-butyl group, in order to obtain the acid-labile groups described above. However, acetals are also suitable.

All compounds that liberate acid on exposure to radiation may be used as photo acid generators. Onium compounds, as described, for example, in European Patent No. EP 0 955 562, are advantageously used.

For example, methoxypropyl acetate, cyclopentanone, cyclohexanone, γ-butyrolactone, ethyl lactate, diethylene glycol diethyl ether, diethylene glycol dimethyl ether, or a mixture of at least two of these compounds may be used as a solvent of the resist. In general, however, it is possible to use all customary solvents or mixtures thereof which are capable of taking up the resist components to give a clear, homogeneous solution having a long shelf-life and which ensure a good layer quality on exposure of the substrate to light.

The resist generally has the following composition: a film-forming polymer, 1–50% by weight, preferably 2–10% by weight; a photo acid generator, 0.01–10% by weight, preferably 0.01–0.1% by weight; and a solvent, 50–99% by weight, preferably 88–97% by weight.

In addition to the compounds, the photoresist may contain further components. For example, additives that increase the quantum yield on liberation of the acid may be present. Furthermore, it is possible to use additives which influence the resist system advantageously with respect to resolution, film formation properties, shelf life, service life effectiveness, etc.

The photoresist is applied to the substrate by customary methods, for example by spin-coating or spraying on or by immersion methods. After application of the photoresist, the solvent is removed. For this purpose, the substrate with the applied photoresist is heated so that the solvent evaporates. If necessary, the drying stage may also be carried out under reduced pressure.

The dried resist film is now structured in a customary manner. For this purpose, a latent image of the desired structure, which contains, in the exposed parts, the acid liberated from the photo acid generator, is first produced in the resist film by selective irradiation with the aid of a photomask or by direct irradiation with focused electrons or ions. In a heating step following the exposure (postexposure bake "PEB"), the acid-labile groups on the polymer are cleaved and polar groups liberated by the catalytic effect of the acid produced by the exposure. In the exposed parts, the resist film therefore becomes soluble in an alkaline developer. In the subsequent development step, in which the resist film is treated with a polar developer solution, for example a 2.38% strength solution of tetramethylammonium hydroxide in water, the exposed parts of the substrate are dissolved away and a positive relief pattern is thus produced in the resist film. In the exposed parts, the substrate is now bare, whereas the unexposed parts are still protected by the solid resist film. If anchor groups for linking the amplification agent are already available in the polymer, the amplification of the structured resist can be carried out directly after the structuring. If the anchor groups are present in protected form, they must first be liberated before the amplification. Thus, for example, the polar groups that can be liberated from the acid-labile groups also can act as anchor groups for linking the amplification agent. In this case, the structured resist can first be exposed to a floodlight in order also to liberate acid from the photo acid generator in the unexposed parts. Heating is then carried out so that the acid-labile groups of the polymer are cleaved and the polar groups, for example a hydroxyl group, are available for the amplification.

In a particular embodiment of the invention, the photoresist contains, as an additional component, a thermoacid generator. The thermoacid generator must be such that it remains substantially stable at temperatures which are reached during evaporation of the solvent after application of the photoresist or at the temperature used in the PEB step. The acid from the thermoacid generator is liberated at temperatures of from 80 to 200° C. Suitable thermoacid generators are, for example, benzylthiolanium compounds. The acid-labile groups on the polymer are cleaved in the unexposed sections of the resist which remain on the substrate by the acid liberated from the thermo acid generator. In this case too, after elimination of the acid-labile groups, nucleophilic anchor groups to which the amplification agent can be linked are available in the film-forming polymer.

For the amplification of the structured resist, the amplification agent can be deposited from the gas phase on the structured resist. Preferably, however, the amplification agent is added as a solution to the structured resist. The solvent must dissolve the amplification agent or must be capable of forming an emulsion with it. The structured resist may be insoluble or only sparingly soluble in the solvent. However, it is desirable for the solvent of the amplification agent to be able to swell the structured resist so that the amplification agent can also diffuse into deeper layers of the resist and produce amplification of the structured resist there. If the swellability of the resist in the solvent used for the amplification is too low, appropriate swelling promoters may be used. Suitable swelling promoters are generally low molecular weight polar molecules, but nonpolar swelling promoters are also suitable for specific applications. Suitable swelling promoters are, for example, low molecular weight ethers, esters, halogenated solvents, silanes or siloxanes which do not themselves react with the reactive groups on the polymer or on the amplification agent. For example, methoxypropyl acetate, cyclopentanone, cyclohexanone, toluene, heptane, decane or a mixture of at least two of these solvents is suitable as a solvent for the amplification agent. In general, however, all customary solvents or mixtures thereof which are capable of taking up the components of the amplification agent solution to give a clear, homogeneous solution having a long shelf life and which do not react with reactive groups on the polymer or on the amplification agent may be used.

After addition of the amplification agent, a reaction takes place between the anchor group provided on the polymer and the linkage group provided on the amplification agent, with formation of a chemical bond. The nucleophilic group attacks the isocyanate group or thiocyanate group. The nucleophilic group must be such that a sufficiently rapid reaction with the isocyanate group or thiocyanate group is ensured. It is possible in principle to use any desired groups, provided that they have sufficient nucleophilic character with respect to the isocyanate group or thiocyanate group. However, hydroxyl groups, amino groups and thiol groups are particularly suitable. However, CH-acidic compounds, such as, for example, cyanoacetic esters, malononitrile derivatives and acetylacetone derivatives, may also be reacted with the isocyanate group or the thiocyanate groups. The reaction with the isocyanate group or thiocyanate group accordingly gives a urethane group, a urea group or a thiourea group, via which the amplification agent is linked to the polymer.

In order to accelerate the amplification reaction, a reaction promoter may be added to the amplification agent. Suitable reaction accelerators are, for example, tertiary amines, such as 1,8-diazabicyclo[5.4.0]undec-7-ene (DBU), 1,5-diazabicyclo[4.3.0]non-5-ene (DBN), 1,4-diazabicyclo[2.2.2]octane (DABCO), tetramethyl-guanidine (TMG), N-dimethylaminopropyl ethyl ether, bis(N-dimethylaminoethyl) methylamine, N-dimethyl-benzylamine, N-methyl-N-dimethylaminoethylpiperazine, and N-methylmorpholine. Further suitable reaction accelerators are described, for example, in Kleimann, Helmut; *Die angewandte makromolekulare Chemie [Applied macromolecular chemistry]*, 98 (1981) 185–194.

The amplification agent preferably has at least two linkage groups. In this way, further crosslinking of the polymers of the structured resists can be achieved and hence a higher stability of the amplified structure.

As already mentioned, the process according to the invention can be carried out in two ways, these differing in the positioning of isocyanate groups or thiocyanate groups on the one hand and nucleophilic groups on the other hand on the polymer and amplification agent.

According to a first embodiment of the process, the anchor group is in the form of an isocyanate group or thiocyanate group and the linkage group in the form of a nucleophilic group. In this embodiment, the film-forming polymer of the photoresist thus includes the isocyanate groups or thiocyanate groups, while the amplification agent includes nucleophilic groups for linkage to the polymer by reaction with the isocyanate group or thiocyanate group.

In this process variant, the film-forming polymer includes, in addition to the acid-labile groups, repeating units that have an isocyanate group or a thiocyanate group. These repeating units are preferably also formed in such a way that they produce high transparency of the polymer at very short wavelengths of less than 200 nm, preferably less than 160 nm, in particular at 157 nm. Preferred repeating units are shown below as typical examples of the large number of possible repeating units.

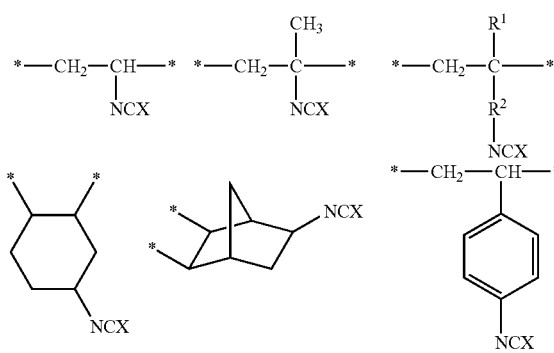

wherein,

X is O or S;

$R^1$ is an alkyl group having 1 to 10 carbon atoms, which may be straight-chain or branched and in which one or more hydrogen atoms may have been replaced by fluorine atoms, or is —CN or —$R^2$—C(O)O—$R^3$;

$R^2$ is a single bond, a bivalent alkyl group having 1 to 10 carbon atoms, which may be straight-chain or branched, a bivalent aryl group having 6 to 20 carbon atoms, it also being possible in these groups for one or more hydrogen atoms to have been replaced by fluorine atoms; and $R^3$ is an alkyl group having 1 to 10 carbon atoms, which may be straight-chain or branched and in which one or more hydrogen atoms may have been replaced by fluorine atoms.

The repeating units can be introduced into the film-forming polymer by copolymerization of corresponding unsaturated monomers. Accordingly, the amplification agent must have a nucleophilic group for linkage to the isocyanate group or thiocyanate group of the polymer. Particularly preferably, the amplification agent includes two terminal nucleophilic groups, in particular amino groups.

Particularly preferred amplification agents are: bis(aminomethyl)adamantane, bis(aminoethyl)adamantane, bis(aminopropyl)adamantane, norbornyldiamine, bis-(aminomethyl)norbornane, bis(aminoethyl)norbornane, bis(aminopropyl)norbornane, bis(aminomethyl)-bicyclo[2.2.2]-octane, bis(aminoethyl)-bicyclo[2.2.2]-octane, bis(aminopropyl)bicyclo[2.2.2]octane, bis-(aminomethyl)tricyclo[5.2.1.0$^{2,6}$]decane, bis-(aminoethyl)-tricyclo[5.2.1.0$^{2,6}$]decane and bis-(aminopropyl)-tricyclo[5.2.1.0$^{2,6}$]decane.

The nucleophilic group used may also be a hydroxyl group. Preferred amplification agents containing hydroxyl groups correspond to the abovementioned amplification agents, but the amino group has been replaced by a hydroxyl group.

Examples of suitable aromatic amplification agents are

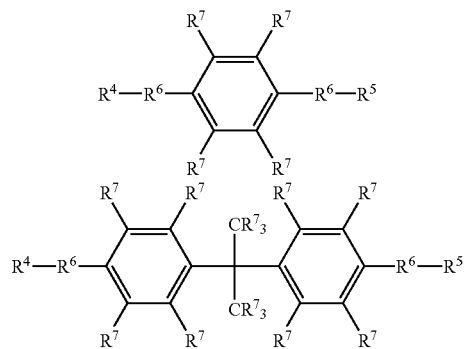

wherein R$^4$ is an —NH$_2$ or —OH group,
R$^5$ is a hydrogen atom, a CH$_3$, a CH$_2$F, a CHF$_2$ or a CF$_3$ group or an NH$_2$ group or an OH group,
R$^6$ is a single bond or a bivalent alkyl group having 1 to 10 carbon atoms, it being possible for the bivalent alkyl radical also to be partly fluorinated or perfluorinated, and
R$^7$, independently for each position, is a hydrogen atom or a fluorine atom.

The substituents R$^6$ may be disposed in any desired position on the aromatic ring, i.e. in the ortho, meta, or para position relative to one another. The other free valencies of the aromatic ring are then saturated by R$^7$.

Furthermore, heteroaromatic amplification agents and amplification agents having more than two nucleophilic groups may also be used. Exemplary compounds are shown below.

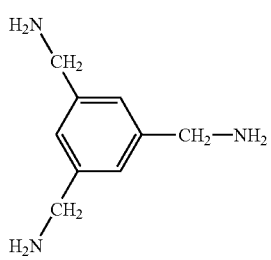

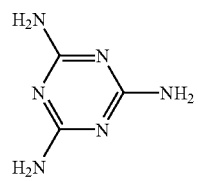

According to the second process variant, the process is carried out in such a way that the linkage group is in the form of an isocyanate group or thiocyanate group and the anchor group is in the form of a nucleophilic group. In this process variant, the isocyanate groups or thiocyanate groups are therefore present on the amplification agent, while the nucleophilic groups are bound in the film-forming polymer. In this process variant, the polar groups contained in the acid-labile groups can be used as nucleophilic groups. In addition to repeating units which include the nucleophilic groups in protected form, repeating units that contain the polar groups already in unprotected form, i.e. for example as an amino group or hydroxyl group, may also be contained in the polymer. The repeating units are always such that they produce as little absorption of the film-forming polymer as possible at very short wavelengths, in particular at a wavelength of 157 nm. Exemplary repeating units are shown below.

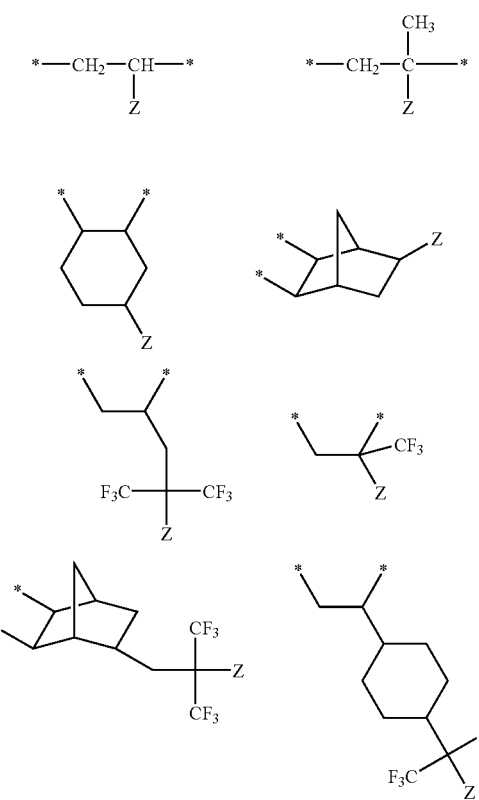

-continued

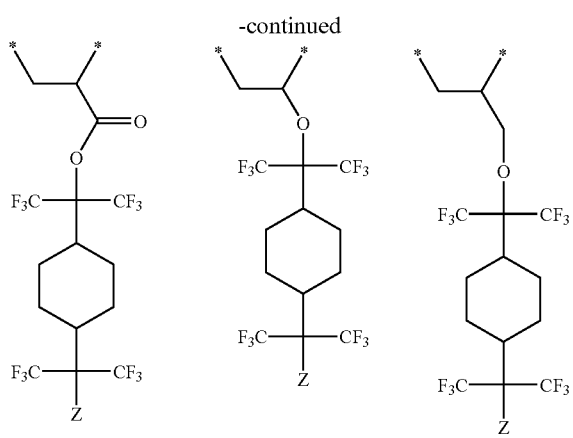

Z is in general a nucleophilic group, in particular an amino group or a hydroxyl group. The repeating units can be introduced into the film-forming polymer, for example, by copolymerization of the corresponding unsaturated monomers.

For linkage to the nucleophilic groups of the film-forming polymer, the amplification agent must accordingly have one or more isocyanate groups or thiocyanate groups. If the amplification agent has a plurality of isocyanate groups or thiocyanate groups, additional crosslinking of the film-forming polymer is produced. Typical examples of amplification agents that include isocyanate groups are mentioned below.

Particularly preferred alicyclic amplification agents are: bis(isocyanatomethyl)adamantane, bis(isocyanatoethyl)-adamantane, bis-(isocyanato-propyl)-adamantane, norbornyl diisocyanate, bis(isocyanatomethyl)norbornane, bis(isocyanatoethyl)norbornane, bis(isocyanatopropyl) norbornane, bis-(isocyanatomethyl)-bicyclo[2.2.2]octane, bis-(isocyanato-ethyl)bicyclo [2.2.2]octane, bis(isocyanatopropyl)-bicyclo[2.2.2]octane, bis(isocyanato-methyl)-tricyclo[5.2.1.0$^{2,6}$]-decane, bis(isocyanato-ethyl)-tricyclo[5.2.1.0$^{2,6}$]-decane and bis(isocyanatopropyl)-tricyclo[5.2.1.0$^{2,6}$]decane.

In the corresponding preferred thiocyanate compounds, the isocyanate group is exchanged for a thiocyanate group in the abovementioned compounds.

Preferred aromatic amplification agents are shown below:

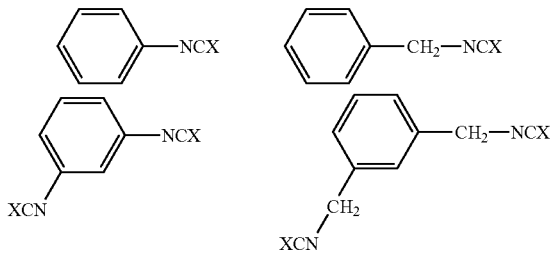

wherein, X is oxygen (O) or sulfur (S).

Other features that are considered as characteristic for the invention are set forth in the appended claims.

Although the invention is illustrated and described herein as embodied in a process for the aromatization and cycloaliphatization of photoresists in the UV range, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DESCRIPTION OF THE PREFERRED EMBODIMENTS

Figure 1A:
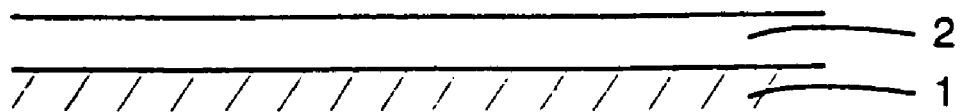
FIGS. 1A–1D are diagrammatic sectional views showing the steps for carrying out the process according to the invention.
Figure 1B:
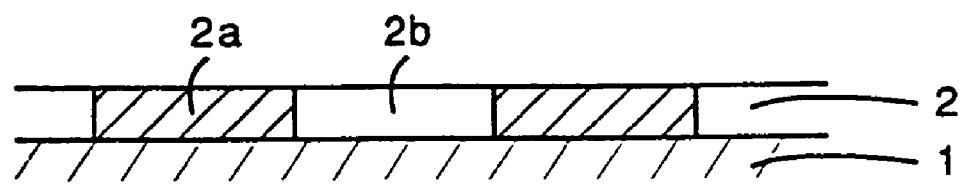
Figure 1C:
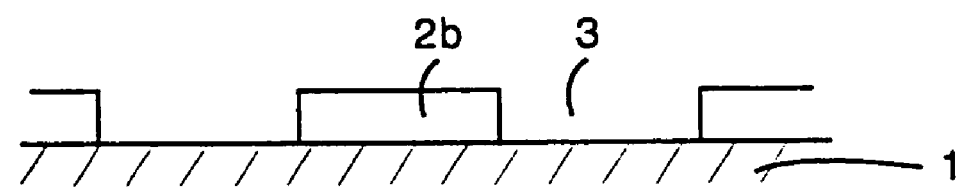
Figure 1D:
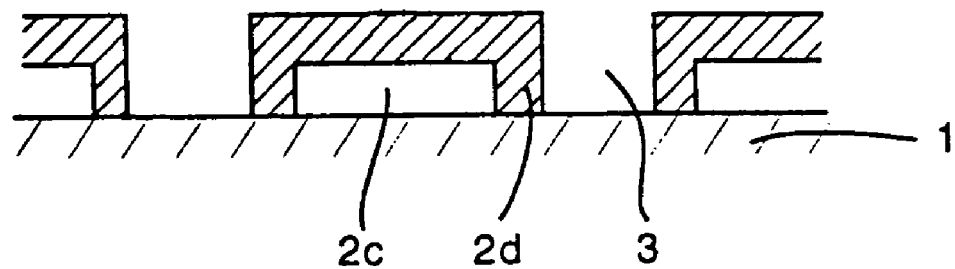

Referring now to the figures of the drawings in detail and first, particularly to FIGS. 1A–1D thereof, there is shown the sequence of process steps which are passed through on carrying out the process according to the invention. First, a photoresist 2 is produced on the substrate, as shown in FIG. 1A. In this case, the substrate 1 is, for example, a silicon wafer. The resist film 2 is produced by applying a solution of the photoresist to the substrate 1, for example by spin-coating, and then evaporating the solvent. The resist film 2 is now exposed, an acid is liberated in the exposed parts 2a from the photoresist acid generator as shown in FIG. 1B, while the resist film remains unchanged in the unexposed parts 2b. This is followed by a heating step (PEB, post exposure bake) in which the acid-labile groups of the polymer are cleaved by the liberated acid in the exposed parts 2a. The exposed resist is then developed with an aqueous alkaline solution, for example a 2.38% strength solution of tetramethylammonium hydroxide in water, the exposed parts 2a, in which the polarity of the polymer contained in the resist is increased, being detached from the substrate 1. As shown in FIG. 1C, the unexposed sections 2b now form raised parts by which the substrate 1 is protected, whereas the exposed parts 2a form trenches 3 in which the substrate 1 is bared. In the parts 2b, the anchor groups are now liberated for linkage to the amplification agent, by first exposing the parts 2b and then heating the substrate with the exposed resist sections 2b. The acid-labile groups of the polymers are now eliminated in the resist structures 2b too and, for example, hydroxyl groups are liberated as anchor groups. A solution of an amplification agent is then added to the surface of the substrate 1 and of the resist section 2b. The resist structures 2b are swollen by the solvent so that amplification agent can penetrate and can react with the anchor groups on the polymer. Incorporation of the amplification agent results in growth of the resist sections 2b in the vertical and horizontal direction. The resist structures 2b grow in their dimensions so that the state shown in FIG. 1D is reached. The layer thickness of the raised resist sections 2b has increased and the width of the trenches 3 disposed between the raised resist sections 2b has decreased. The resist structures 2b include a core 2c in which no amplification has taken place since the amplification agent could not diffuse into the interior parts of the resist structure 2b. The core 2c is surrounded by an amplified layer 2d. The resist structure 2b therefore has a greater layer thickness and a smaller width of the trenches 3 compared with the unamplified state shown in FIG. 1C. As a result of the amplified layer 2b, which includes aromatic or cycloaliphatic groups subsequently introduced, the resist structures acquire increased etch resistance to a plasma, in particular an oxygen plasma. In the subsequent step, a plasma transfers the structure of the trenches 3 to the substrate 1.

Figure 2A:
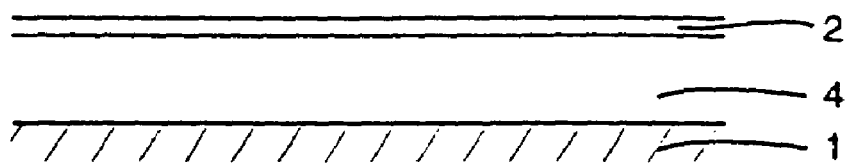
FIGS. 2A–2D are diagrammatic sectional views showing the process according to the invention in which a two-layer resist is used.
Figure 2B:
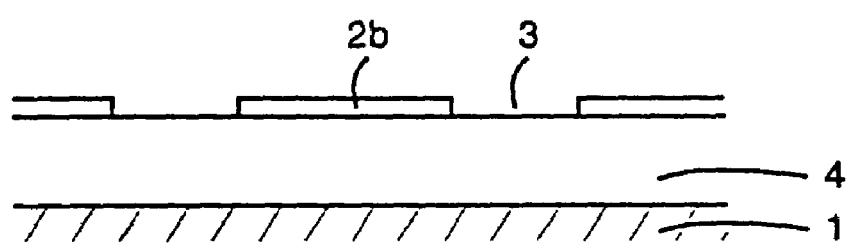
Figure 2C:
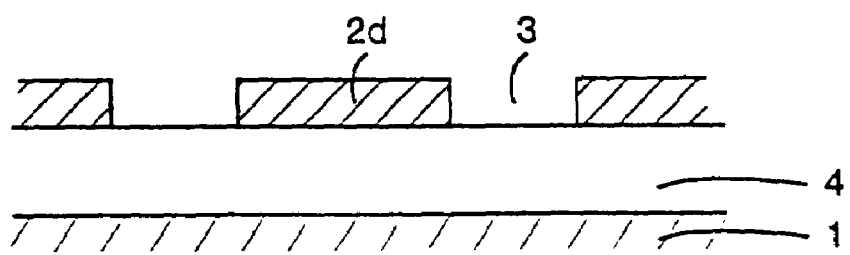
Figure 2D:
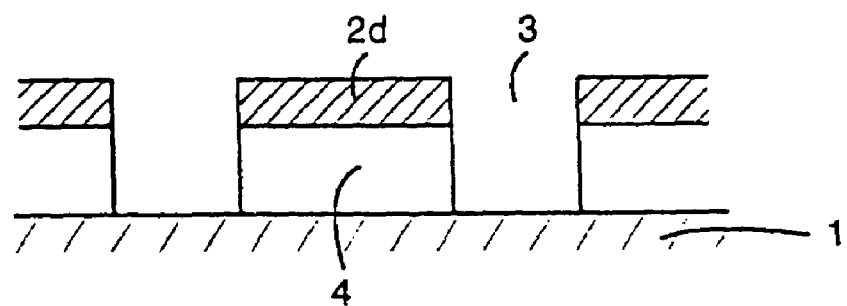

FIGS. 2A–2D show the process sequence for a two-layer resist. This process variant permits the use of very thin layers of the photoresist and exact focusing of short-wave exposure radiation even when no flat surface is available on the substrate owing to the fact that electronic components have already been integrated. The substantial steps for the process correspond to the process sequence shown in FIGS. 1A–1D. First, a bottom resist 4 that is not photosensitive and is formed, for example, from a novolak resin is applied to the substrate 1. A thin layer of the photoresist 2 is then applied to the layer of the bottom resist 4. The photoresist layer 2 is now exposed and develdped as described in FIG. 1B and c so that a state shown in FIG. 2B is reached. Raised sections 2b have formed on the bottom resist 4, between which trenches 3 are disposed. The solution of an amplification agent that includes aromatic or cycloaliphatic groups is now applied to the surface of the resist structure 2b and the bare sections of the bottom resist 4. The resist structures 2b are swollen by the solvent so that the amplification agent can penetrate and reacts with the anchor groups of the polymer contained in the resist. For this purpose, the polymer has isocyanate groups or thiocyanate groups and the amplification agent has a nucleophilic group, for example an amino group. There is an increase in the volume of the resist structures 2b, the increase leading to a substantial increase in layer thickness, whereas the constriction of the trenches 3 is less pronounced in comparison with the process shown in FIG. 1, owing to the smaller layer thickness of the photoresist 2. A state shown in FIG. 2C is reached. Amplified sections 2d whose etch resistance to an oxygen plasma has been increased by the introduction of aromatic or cycloaliphatic groups have formed on the bottom resist 4. An oxygen plasma transfers the structure of the trenches 3 to the bottom resist 4. The bottom resist 4 is removed in the sections of the trenches 3 through the resist 4, so that the substrate 1 is bare in the trenches 3, and the trenches 3 are each bounded on both sides by raised parts which are formed in their upper section from a resist amplified by aromatic or cycloaliphatic groups and in their lower section by the material of the bottom resist 4, as shown in FIG. 2D. A fluorine plasma transfers the structure of the trenches 3 can now be etched into the substrate 1.

EXAMPLE

To detect the amplification reaction of isocyanates with primary amines, a copolymer including 82 mol % of tert-butyl methacrylate and 18 mol % of isopropenyl isocyanate is dissolved in toluene. The structure of the polymer is shown below.

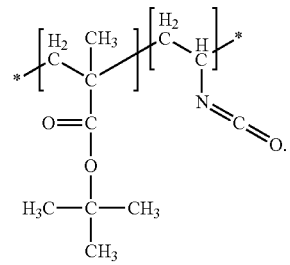

Figure 3:
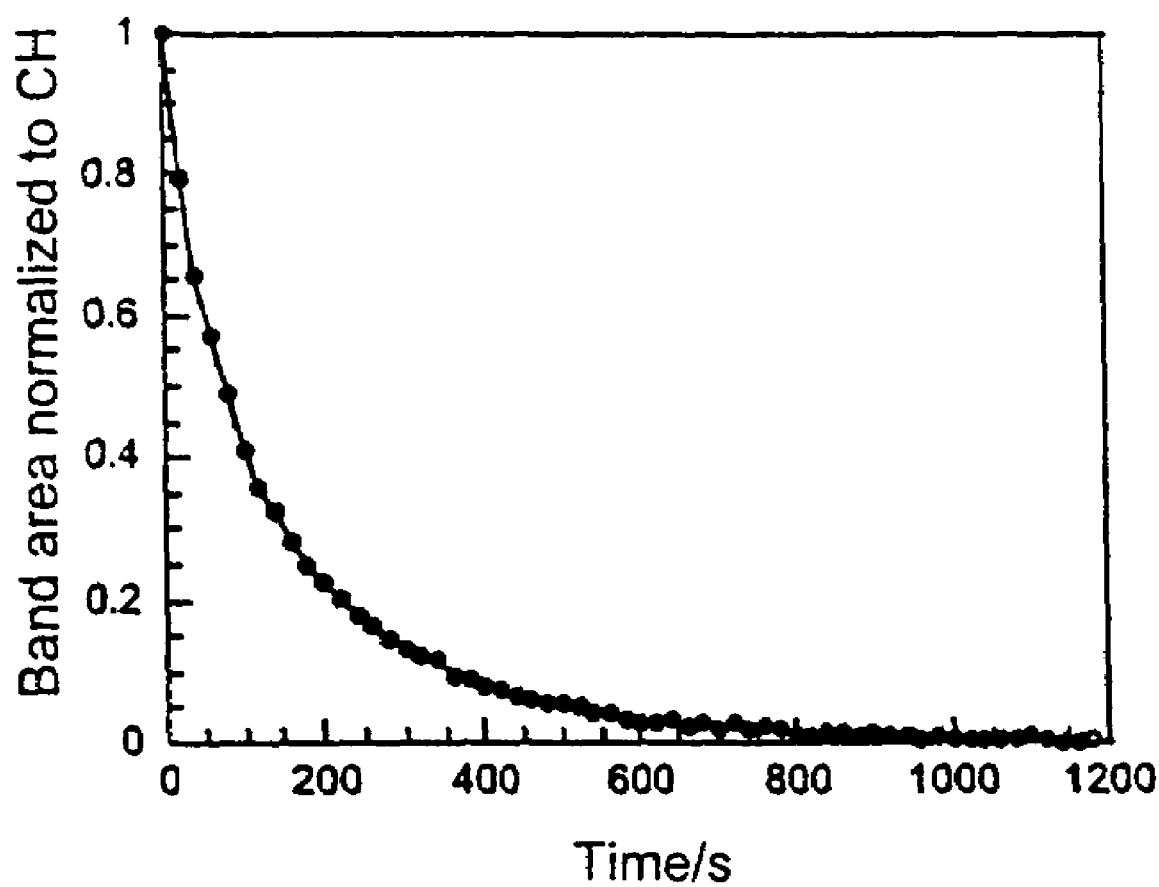
FIG. 3 is a graph plotting a decrease in the isocyanate infrared band of the polymer during the reaction with an amplification agent versus reaction time.

Bisamino-oligodimethylsiloxanes are added to the solution and the reaction is monitored with infrared spectroscopy. The decrease in the isocyanate band as a function of time is shown in FIG. 3. The intensity plotted along the Y axis corresponds in each case to the integral of the isocyanate band. The decrease in the intensity of the isocyanate band corresponds to the rate of linkage of the amplification agent to the polymer. The reaction takes place rapidly and the intensity of the isocyanate band decreases to as low as 50% of its initial intensity within 100 seconds. The reaction therefore takes place more rapidly than a linkage to carboxylic anhydride groups, so that the process according to the invention permits shorter throughput times and results in resist structures being obtained more reliably.

I claim:

1. A process for amplifying a structured resist, which comprises the following steps:
    applying a chemically amplified photoresist to a substrate, the photoresist including a film-forming polymer, a photo-acid generator, and a solvent, the film-forming polymer including acid-labile groups eliminatable by acid to liberate groups increasing solubility of the polymer in aqueous alkaline developers and anchor groups for linking amplification agents;
    drying the photoresist to give a photoresist film;
    structuring the resist film to give a structured resist;
    applying an amplification agent to the structured resist in a non-polar solvent, the amplification agent being a compound having an alicyclic hydrocarbon group, and the amplification agent having a linkage group for linking the amplification agent to one of the anchor groups of the polymer to form a chemical bond and link the amplification agent to the polymer by a covalent bond;
    the amplification agent being mixed with a reaction accelerator being a tertiary amine selected from the group consisting of 1,8-diazabicyclo[5.4.0]undec-7-ene (DBU), 1,5-diazabicyclo[4.3.0]non-5-ene (DBN), 1,4-diazabicyclo[2.2.2]octane (DABCO), tetramethylguanidine (TMG), N-dimethylaminopropyl ethyl ether, bis(N-dimethylaminoethyl)methylamine, N-dimethylbenzylamine, N-methyl-N-dimethylaminoethylpiperazine, and N-methylmorpholine;
    and removing excess amplification agent;
    the linkage group and the anchor group forming a pair, (a) either one linkage group or one anchor group having a structure —N=C=X, with X being selected from the group consisting of O and S, and the other of these groups having (b) a nucleophilic group.

2. The process according to claim 1, which further comprises:

protecting the anchor groups to form protected anchor groups; and liberating the anchor groups from the protected anchor groups.

3. The process according to claim 1, wherein the amplification agent has a hydrogen atom replaced by a fluorine atom.

4. The process according to claim 1, wherein the amplification agent has each hydrogen atom replaced by a respective fluorine atom.

5. The process according to claim 1, wherein the nucleophilic group is selected from the group consisting of a hydroxyl group, an amino group, and a thiol group.

6. The process according to claim 1, which further comprises:

including, in the photoresist, a thermo acid generator for liberating the anchor groups, the thermo acid generator liberating an acid at a given temperature; and heating the structured resist to the given temperature to liberate the acid from the thermo acid generator.

7. The process according to claim 1, wherein the amplification agent includes at least two linkage groups.

8. The process according to claim 1, which further comprises exposing the resist film to radiation having a wavelength less than 160 nm in order to structure the resist film.

9. The process according to claim 1, which further comprises adding an amplification agent as a solution to the structured resist.

10. The process according to claim 1, wherein:

the anchor group of the polymer is selected from the group consisting of an isocyanate group and a thiocyanate group;

and the linkage group on the amplification agent is the nucleophilic group.

11. The process according to claim 1, wherein:

the linkage group on the amplification agent is selected from the group consisting of an isocyanate group and a thiocyanate group; and the anchor group on the polymer is the nucleophilic group.

12. The process according to claim 1, wherein:

said non-polar solvent is selected from the group consisting of methoxypropyl acetate, cyclopentanone, cyclohexanone, toluene, heptane, decane, or a mixture of at least two of these solvents.

* * * * *